US007132842B2

(12) United States Patent
Miyagawa

(10) Patent No.: US 7,132,842 B2
(45) Date of Patent: Nov. 7, 2006

(54) SEMICONDUCTOR DEVICE, DRIVING METHOD AND INSPECTION METHOD THEREOF

(75) Inventor: Keisuke Miyagawa, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 64 days.

(21) Appl. No.: 10/740,605

(22) Filed: Dec. 22, 2003

(65) Prior Publication Data

US 2004/0246757 A1 Dec. 9, 2004

(30) Foreign Application Priority Data

Dec. 26, 2002 (JP) ............................ 2002-378556

(51) Int. Cl.
*G01R 31/28* (2006.01)
*G11C 7/00* (2006.01)

(52) U.S. Cl. ...................... 324/765; 324/770; 365/201

(58) Field of Classification Search .................... None
See application file for complete search history.

(56) References Cited

U.S. PATENT DOCUMENTS 5,436,912 A * 7/1995 Lustig ........................ 714/719
5,936,892 A * 8/1999 Wendell ................ 365/189.03

FOREIGN PATENT DOCUMENTS

| | | |
|---|---|---|
| GB | 2 337 627 | 11/1999 |
| JP | 04-072552 | 3/1992 |
| JP | 07-287247 | 10/1995 |
| JP | 11-231281 | 8/1999 |
| JP | 11-326872 | 11/1999 |

OTHER PUBLICATIONS

International Search Report dated Mar. 2, 2004 for PCT/JP03/15706.
International Preliminary Examination Report dated Apr. 20, 2004 for PCT/JP03/15706.
International Preliminary Report dated Jul. 27, 2004 for PCT/JP03/15706.

* cited by examiner

*Primary Examiner*—Ernest Karlsen
(74) *Attorney, Agent, or Firm*—Eric J. Robinson; Robinson Intellectual Property Law Office, P.C.

(57) ABSTRACT

For an inspection of a display device which incorporates a driver circuit around pixels, a start pulse and a clock pulse are required to be inputted as inspection signals. The more complex the driver circuit is, the more complexity the start pulse and the clock pulse tend to have, which will increase the manufacturing cost of inspection signals. In addition, since a clock generator is required, cost of an inspection device is increased. Furthermore, it will lead to a longer inspection time. By setting all the power supplies for the driver circuit at a desired potential, a desired potential is outputted regardless of an input signal.

9 Claims, 9 Drawing Sheets

(A)

(B)

(A)

(B)

(A)

(B)

SEMICONDUCTOR DEVICE, DRIVING METHOD AND INSPECTION METHOD THEREOF

TECHNICAL FIELD

The present invention relates to a configuration of a semiconductor device having transistors and a driving method thereof. More particularly, the invention relates to a configuration of a display device having thin film transistors (hereinafter referred to as 'TFTs') and the like formed on an insulator, and to a driving method thereof. In addition, the invention relates to an electronic apparatus using a semiconductor device having a such configuration and a driving method. Furthermore, the invention relates to an inspection method using such a driving method and an inspection device.

BACKGROUND ART

In recent years, active matrix display devices are actively developed. According to the active matrix, a high-quality image display with few incidental images is realized by disposing an active element in each pixel. Furthermore, high-performance display devices with small external load are developed by incorporating driver circuits such as a shift register on an insulating substrate around pixels.

As for a display device having pixels arranged in a matrix, such problems as breaking and short-circuit of wirings are likely to occur in the manufacturing steps. Therefore, electrical inspections are frequently carried out during the manufacturing steps (see Patent Document 1).

[Patent Document 1]

Japanese Patent Laid-Open No. Hei 7-287247

DISCLOSURE OF THE INVENTION

[Problems to be Solved by the Invention]

When driver circuits are incorporated in the periphery of the pixels, inspections of pixel wirings are made complex. FIG. 2 shows an example of an inspection of pixel wirings of a display device which incorporates driver circuits.

The display device in FIG. 2 includes a pixel portion 204, a source driver 209, a video signal input terminal 210, and a gate driver 211. The pixel portion 204 includes pixels 201 which are arranged in matrix of m rows by n columns, n source lines 202 corresponding to the columns, and m gate lines 203 corresponding to the rows. The source driver 209 includes n video signal switches 207 corresponding to the columns and a source scan circuit 208. The video signal switch 207 is a switch which sequentially supplies a video signal inputted from the video signal input terminal 210 to the source lines 202 according to the scanning by the source scan circuit 208.

In the display device in FIG. 2, an intersection of the source line 202 and the gate line 203 is likely to be short-circuited. In order to carry out an inspection for this portion, the source line 202 and the gate line 203 are made to have a potential difference, and a current value at this point is measured. If the current value is over a specified value, it can be determined that they are short-circuited.

As a method for giving a potential difference, it is required that a gate start pulse or a gate clock pulse is inputted to the gate driver 211 to apply a potential to the gate line 203, while a source start pulse or a source clock pulse is inputted to the source scan circuit 208 and further a potential is applied to the video signal input terminal 210 to apply the potential to the source line 202, thereby measuring a current at this point. At this time, a clock generator which is capable of outputting a start pulse and a clock pulse is required as well as a voltage source and an ampere meter.

As described above, for the inspection of a display device which incorporates driver circuits in the periphery of the pixels, a start pulse or a clock pulse is required to be inputted as an inspection signal. The more complex the driver circuits are, the more complexity the start pulse and clock pulse tend to have, which will increase the manufacturing cost of inspection signals. In addition, since the clock generator is required, cost of the inspection device is increased. Further, as a certain period is required for the source line 202 and the gate line 203 to reach the desired state since the operation of the driver circuits has started, inspection time may be prolonged correspondingly.

In view of the foregoing drawbacks, the invention intends to provide a semiconductor device which obtains a desired output only by controlling a power supply even in the case of incorporating a complex driver circuit, and a driving method thereof.

[Means for Solving the Problems]

A source and a drain of a TFT can be shown by an identical configuration, therefore, one of them is referred to as a first electrode while the other is referred to as a second electrode in this specification. In addition, a state in which a voltage over a threshold value is applied between the gate and the source of a TFT, whereby a current flows between the source and the drain thereof is referred to as to turn ON in this specification. Meanwhile, a state in which a voltage equal to or less than a threshold value is applied between the gate and the source of a TFT, whereby no current flows between the source and the drain thereof is referred to as to turn OFF. It should be noted that although a TFT is employed as an example for an element which configures a semiconductor device in this specification, the invention is not limited to this. For example, a MOS transistor, an organic transistor, a bipolar transistor, a molecular transistor, and the like may be employed.

A switch element has a state in which a current flows between two electrodes thereof and a state in which no current flows between them. In this specification, the state in which a current flows between the two electrodes is referred to as to turn ON while the state in which no current flows between them is referred to as to turn OFF. These two electrodes are each referred to as a first electrode and a second electrode respectively. In addition, an electrode which controls ON/OFF is referred to as a control electrode although the control electrode is not always shown. In this specification, in the case of using a TFT as a switch element, ON/OFF of the switch element corresponds to ON/OFF of the TFT. It should be noted that the switch element is not limited to the TFT as an example. For example, a MOS transistor, an organic transistor, a bipolar transistor, a molecular transistor, and the like may be employed. Alternatively, a mechanical switch can be employed.

By setting all the power supplies at a desired potential, a desired potential is outputted regardless of an input signal.

The semiconductor device of the invention is characterized in that it has a transistor, a power supply terminal, and a ground terminal, and an internal state of the semiconductor device is initialized by setting the power supply terminal and the ground terminal at an equal potential.

The semiconductor device of the invention is characterized in that it has a memory device consisting of transistors, the semiconductor memory device comprises a power supply terminal and a ground terminal, and the memory device is initialized by setting the power supply terminal and the ground terminal at an equal potential.

The semiconductor device of the invention is characterized in that it has a display portion in which pixels are arranged in matrix, it has a gate line, a source line, a power supply terminal, a ground terminal, a row selection scan circuit (gate driver) connected to the gate line, and a column selection scan circuit (source driver) connected to the source line, the power supply terminal and the ground terminal of the row selection scan circuit (gate driver) are set at a first potential to set the gate line at the first potential, the power supply terminal and the ground terminal of the column selection scan circuit (source driver) are set at a second potential which is different from the first potential to set the source line at the second potential, a potential difference is given between the gate line and the source line, and by measuring a current value flowing between the gate line and the source line at this point, it carries out an inspection of whether there is any short-circuit between the gate line and the source line or not.

The semiconductor device of the invention is characterized in that it has a display portion in which pixels are arranged in matrix, it has a gate line, a source line, a power supply terminal, a ground terminal, a row selection scan circuit (gate driver) connected to the gate line, a switch connected to the source line, a column selection scan circuit (source driver) for scanning the switch element, and a video signal input terminal, a control electrode of the switch element is connected to the column selection scan circuit (source driver), a first electrode thereof is connected to the video signal input terminal, a second electrode thereof is connected to the source line, the power supply terminal and the ground terminal of the row selection scan circuit (gate driver) are set at a first potential to set the gate line at the first potential, the power supply terminal and the ground terminal of the column selection scan circuit (source driver) are set at a potential which turns ON the switch element to electrically connect the video signal input terminal to the source line, the video signal input terminal is set at a second potential which is different from the first potential to set the source line at the second potential, a potential difference is given between the gate line and the source line, and by measuring a current value flowing between the gate line and the source line at this point, it carries out an inspection of whether there is any short-circuit between the gate line and the source line or not.

The semiconductor device of the invention is characterized in that it has a current flows between the gate line and the source line, and by measuring a potential difference between the first potential and the second potential at this point, it carries out an inspection of whether there is any short-circuit between the gate line and the source line or not.

The semiconductor device of the invention is characterized in that it has a transistor, a power supply terminal, a ground terminal, and a power supply short-circuiting switch, and the power supply short-circuiting switch is provided so as to short-circuit the power supply terminal and the ground terminal.

The semiconductor device of the invention is characterized in that it has a transistor, a power supply terminal, a ground terminal, a power supply short-circuiting switch, and a power supply connecting switch, the power supply short-circuiting switch is provided so as to short-circuit the power supply terminal and the ground terminal, and power supply connecting switch is provided between the power supply short-circuiting switch and the power supply terminal or the ground terminal.

The semiconductor device of the invention is characterized in that it has a display portion in which pixels are arranged in matrix, it has a write gate line, an erase gate line, a source line, a current supply line, a write gate driver connected to the write gate line, an erase gate driver connected to the erase gate line, a source driver connected to the source line, and a current supply terminal connected to the current supply line, a write switch and an erase switch are provided between the source line and the current supply line, a control electrode of the write switch is connected to the write gate line, a control electrode of the erase switch is connected to the erase gate line, a power supply terminal and a ground terminal of the source driver are set at a first potential to set the source line at the first potential while the current supply terminal is set at a second potential which is different from the first potential to set the current supply line at the second potential, the power supply terminal and the ground terminal of at least one of the write gate driver and the erase gate driver are set at a third potential which turns OFF at least one of the write switch and the erase switch, thereby electrically disconnecting the source line and the current supply line, and by measuring a current value flowing in the power supply terminal and the ground terminal of the source driver or in the current supply terminal at this point, it carries out an inspection of whether there is any short-circuit between the gate line and the source line or not.

The semiconductor device of the invention is characterized in that, a current flows between the source line and the current supply line, and by measuring a potential difference between the first potential and the second potential at this point, it carries out an inspection of whether there is any short-circuit between the gate line and the source line or not.

[Effect of the Invention]

According to the invention, a desired output can be obtained only by controlling a power supply even in the case of incorporating a complex driver circuit. Accordingly, a desired inspection can be carried out easily without the need of complex input signals for an inspection device and the like. Furthermore, in a memory device and the like having a memory circuit and the like, its memory and internal state can be initialized simply by controlling a power supply. As described above, the invention is quite effective.

BRIEF DESCRIPTION OF THE DRAWINGS

FIGS. 3A–B are diagrams showing a driving method of the invention.

BEST MODE FOR CARRYING OUT THE INVENTION

Embodiment Modes of the invention are described below.

(Embodiment Mode 1)

Figure 3:
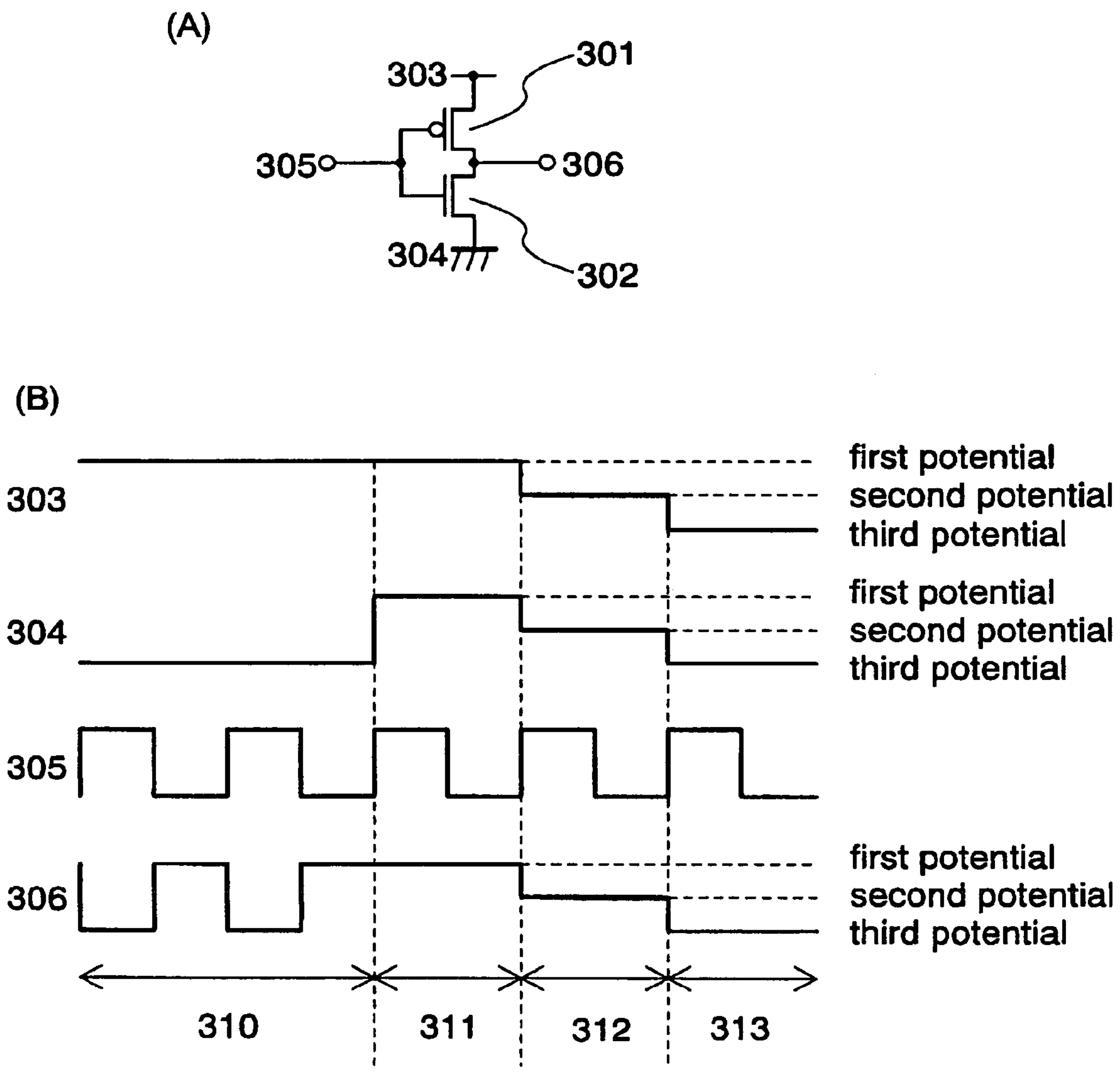
FIG. 3 are diagrams showing a driving method of the invention.

FIG. 3 show an embodiment mode of the invention. This embodiment mode intends to obtain a desired output regardless of an input signal by controlling a power supply of a CMOS circuit.

A CMOS circuit shown in FIG. 3(A) is an inverter which includes a P-channel type TFT 301, an N-channel type TFT 302, a power supply terminal 303, a ground terminal 304, an input terminal 305, and an output terminal 306.

A first electrode of the P-channel type TFT 301 is connected to the power supply terminal 303, a second electrode thereof is connected to the output terminal 306, and a gate thereof is connected to the input terminal 305. A first electrode of the N-channel type TFT 302 is connected to the ground terminal 304, a second electrode thereof is connected to the output terminal 306, and a gate thereof is connected to the input terminal 305.

FIG. 3(B) shows a relationship between the input terminal 305 and the output terminal 306 in the case of controlling the power supply terminal 303 and the ground terminal 304 of the CMOS circuit shown in FIG. 3(A).

A normal operating state 310 is a case where a first potential is applied to the power supply terminal 303 of the CMOS circuit, and a third potential is applied to the ground terminal 304 thereof. At this time, the relationship between the first potential and the third potential is as follows:

the first potential>the third potential.

The first potential and the third potential have a potential difference which enables the CMOS circuit to operate normally. A signal inputted from the input terminal 305 is set to have a voltage amplitude and frequency which enables the CMOS circuit to operate normally. At this time, the inverter operates normally. That is, the signal inputted from the input terminal 305 is inverted and outputted from the output terminal 306.

In a state 1 denoted by 311, the first potential is applied to each of the power supply terminal 303 and the ground terminal 304 of the CMOS circuit. At this time, the output of the inverter which is outputted from the output terminal 306 is at the first potential regardless of an input signal which is inputted from the input terminal 305.

The reason why the output in the state 1 (311) is at the first potential regardless of the input is that the power supply terminal 303 and the ground terminal 304 which are electrically connected to the output terminal 306 are both at the first potential. When the potential at the input terminal 305 is lower than the first potential, the P-channel type TFT 301 is turned ON, and the first potential applied to the power supply terminal 303 is outputted to the output terminal 305. And, when the potential at the input terminal 305 is higher than the first potential, the N-channel type TFT 302 is turned ON, and the first potential applied to the ground terminal 304 is outputted to the output terminal 305. Even when the potential at the input terminal is equal to the first potential, a certain amount of leakage current flows in the TFT even when the gate-source voltage is close to the threshold voltage, therefore, the output terminal reaches the first potential eventually.

In a state 2 denoted by 312, a second potential is applied to the power supply terminal 303 and the ground terminal 304 of the CMOS circuit. The relationship between the first potential, the second potential, and the third potential is as follows:

the first potential>the second potential>the third potential.

At this time, the output of the inverter which is outputted from the output terminal 306 is at the second potential regardless of an input signal which is inputted from the input terminal 305.

In a state 3 denoted by 313, the third potential is applied to the power supply terminal 303 and the ground terminal 304 of the CMOS circuit. At this time, the output of the inverter which is outputted from the output terminal 306 is at the third potential regardless of an input signal which is inputted from the input terminal 305.

In each of the state 2 (312) and the state 3 (313), the output potential is determined for the same reason as the state 1 (311).

In FIG. 3, the potential in each of the state 1 (311), the state 2 (312), and the state 3 (313) is set within the potential in a normal operating state, however, the invention is not limited to this. It may be set at a higher potential or a lower potential than the normal operating potential. In addition, the potential and the frequency inputted to the input terminal 305 at this time may be determined arbitrarily, or alternatively, the input terminal 305 may be in a floating state.

As described above, the output potential can be determined regardless of an input signal by controlling the power supply of the CMOS circuit. Since the input signal can be determined arbitrarily or the input terminal 305 may be in a floating state, a desired output can be obtained easily even without an input signal. In the normal operating state, the output potential is limited to the potential at the power supply terminal 303 or the ground terminal 304 which enables the CMOS circuit to operate normally, therefore, a desired output potential can not be obtained. However in this embodiment mode, since the output potential is equal to those at the power supply terminal 303 and the ground terminal 304 which are set at a desired potential, a desired output potential can be obtained easily.

Although the CMOS circuit shown in this embodiment mode is a general inverter, an output can be determined in other circuits such as a NAND circuit and a NOR circuit in the similar manner by controlling a power supply. Moreover, this is the same in a circuit such as a level shifter, a shift register.

In addition, the invention can be applied to a semiconductor device such as a semiconductor memory device. When the invention is applied to the semiconductor memory device, stored information can be initialized only by controlling a power supply potential.

When the invention is applied to other circuit, an internal state of the circuit can be initialized only by controlling a power supply potential, whereby the same state as the power-ON time can be obtained.

(Embodiment Mode 2)

Figure 4:
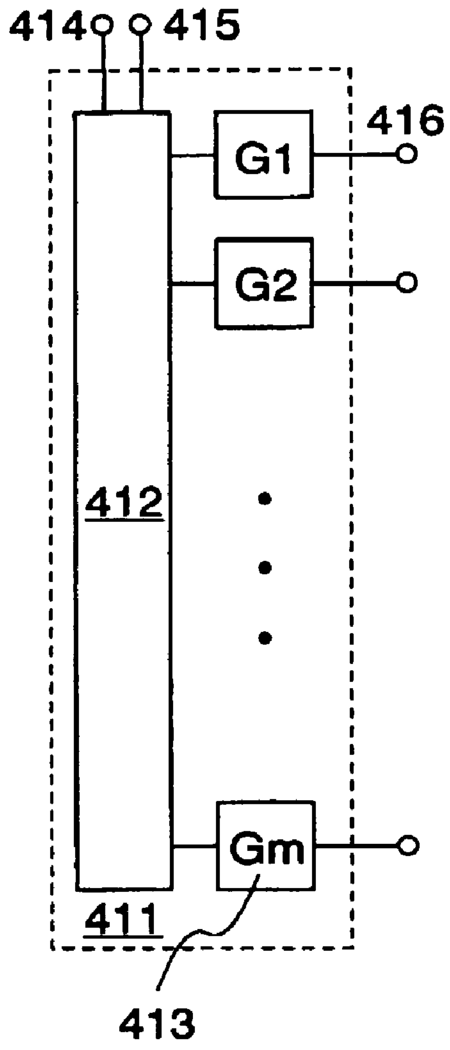
FIGS. 4A–B are diagrams showing a driving method of the invention.
Figure 4:
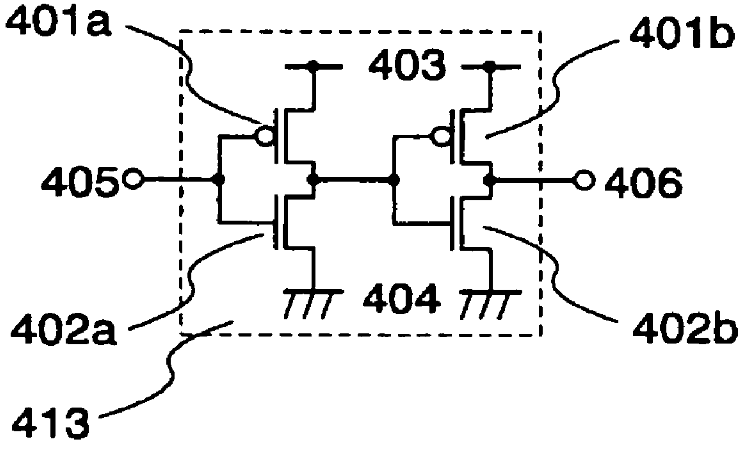
Figure 5:
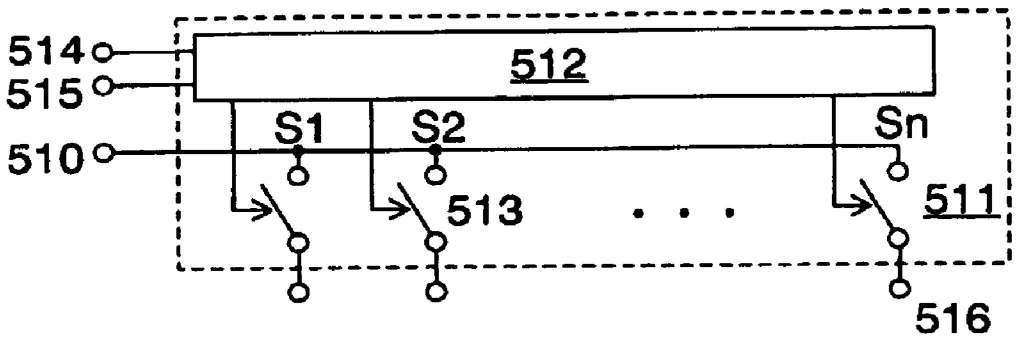
FIGS. 5A–B are diagrams showing a driving method of the invention.
Figure 5:
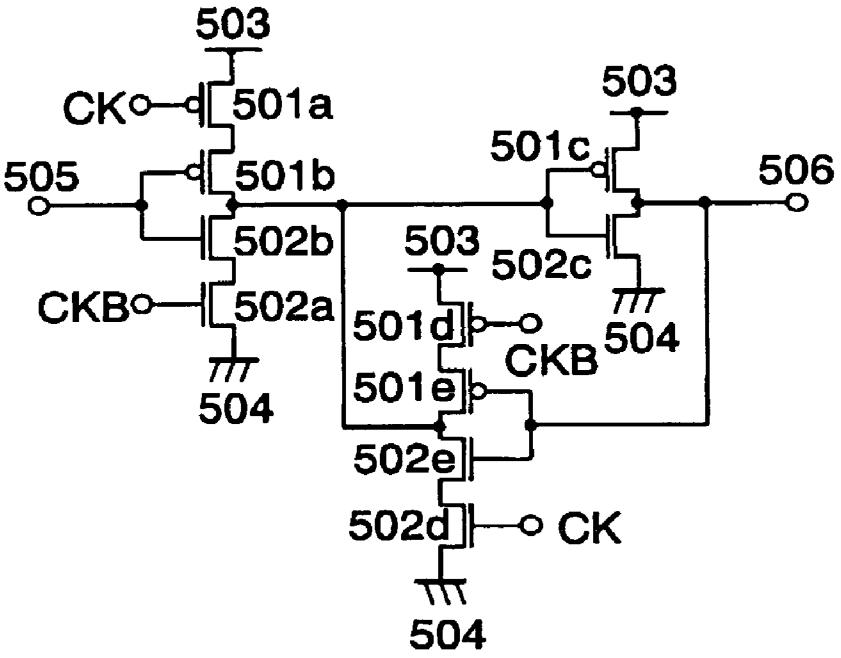

FIG. 4 and FIG. 5 show another embodiment mode of the invention. This embodiment mode intends to obtain a desired output regardless of an input signal by controlling a power supply for a gate driver and a source driver. In addition, by obtaining a desired output by controlling a power supply, this embodiment mode intends to carry out an inspection of whether or not there is any short-circuit between wirings with ease.

Figure 2:
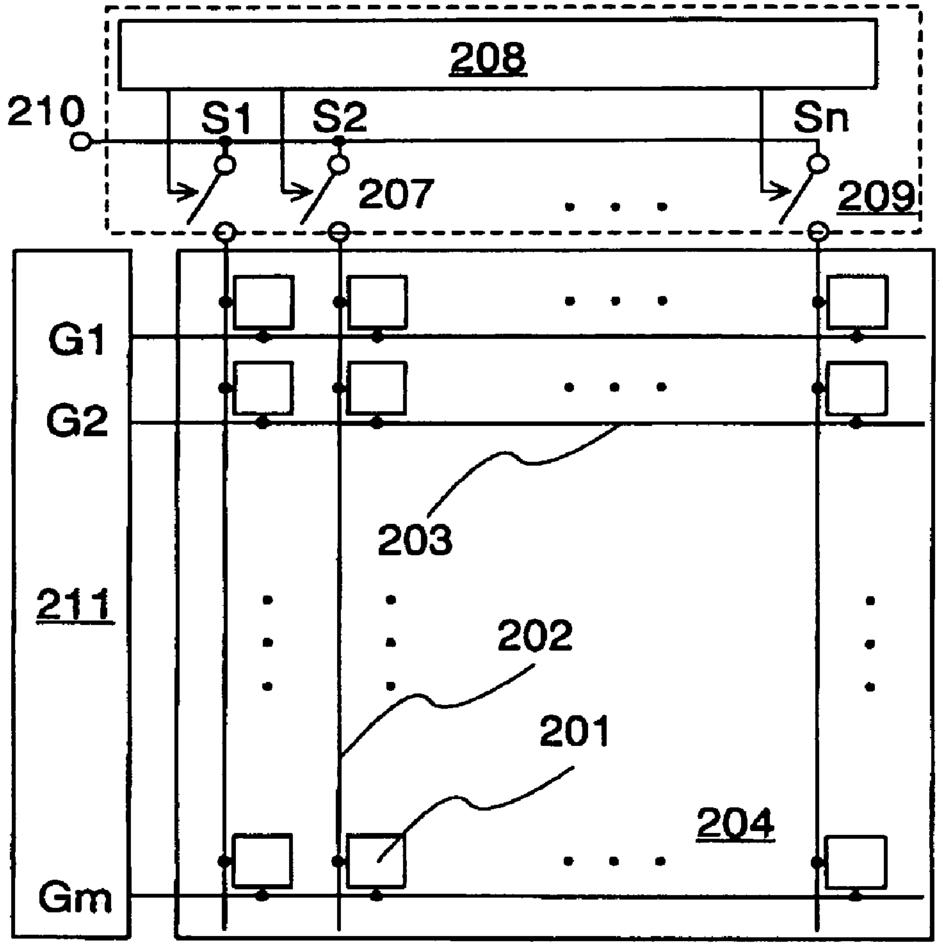
FIG. 2 are an example of a display device which incorporates driver circuits.

A gate driver circuit 411 shown in FIG. 4(A) includes a gate scan circuit 412 and a buffer circuit 413. It should be noted that the gate driver 211 in FIG. 2 is employed as an example of the gate driver 411 in this embodiment mode.

A gate start pulse and a gate clock pulse are inputted from a gate start pulse terminal 414 and a gate clock pulse terminal 415 to the gate scan circuit 412 respectively. According to the timing of the gate clock pulse, the buffer circuits 413 denoted by G1 to Gm are sequentially scanned and driven. The output of the gate scan circuit 412 is amplified in the buffer circuit 413, and then outputted to a gate line terminal 416. It should be noted that the gate line terminal 416 is connected to the gate line 203 in FIG. 2.

In FIG. 4(A), a power supply terminal and a ground terminal of the gate driver 411 are omitted.

FIG. 4(B) shows an example of the buffer circuit 413. The buffer circuit 413 have two stages of CMOS inverters, which includes P-channel type TFTs 401*a* and 401*b*, N-channel type TFTs 402*a* and 402*b*, a power supply terminal 403, a ground terminal 404, an input terminal 405, and an output terminal 406.

A first electrode of the P-channel type TFT 401*a* is connected to the power supply terminal 403, a second electrode thereof is connected to the gate of the P-channel type TFT 401*b* and a gate of the N-channel type TFT 402*b*, and a gate thereof is connected to the input terminal 405. A first electrode of the N-channel type TFT 402*a* is connected to the ground terminal 404, a second electrode thereof is connected to the gate of the P-channel type TFT 401*b* and the gate of the N-channel type TFT 402*b*, and the gate thereof is connected to the input terminal 405. A first electrode of the P-channel type TFT 401*b* is connected to the power supply terminal 403, and a second electrode thereof is connected to the output terminal 406. A first electrode of the N-channel type TFT 402*b* is connected to the ground terminal 404 and a second electrode thereof is connected to the output terminal 406.

The buffer circuit 413 shown in FIG. 4(B) has a different configuration from that of the CMOS inverter shown in Embodiment Mode 1, however, an output can be determined by controlling a power supply as in Embodiment Mode 1.

When the power supply terminal 403 and the ground terminal 404 are set at a desired potential V, the potential at the output terminal 406 is also at the desired potential V.

At this time, the potential V at the output terminal is not influenced by the gate start pulse inputted to the gate start pulse terminal 414, the gate clock pulse inputted to the gate clock pulse terminal 415, and the internal state of the gate scan circuit 412.

A source driver 511 shown in FIG. 5(A) includes a source scan circuit 512 and a video signal switch element 513. It should be noted that the source driver 209 in FIG. 2 is employed as an example of the source driver 511 in this embodiment mode.

A source start pulse and a source clock pulse are inputted from a source start pulse terminal 514 and a source clock pulse terminal 515 to the source scan circuit 512 respectively. According to the timing of the source clock pulse, the video signal switch elements 513 denoted by S1 to Sn are sequentially scanned and driven. A second electrode of the video signal switch element 513 is electrically connected to a video signal input terminal 510 while a first electrode thereof is connected to a source line terminal 516. It should be noted that the source line terminal 516 is connected to the source line 202 in FIG. 2.

In FIG. 5(A), the power supply terminal and the ground terminal of the source driver 511 are omitted.

A video signal corresponding to an image is inputted to the video signal input terminal 510, and it is outputted from the source line terminal 516 through the video signal switch element 513 which is sequentially scanned and driven by the source scan circuit 512.

FIG. 5(B) shows a part of the source scan circuit 512. The source scan circuit 512 consists of the circuits in FIG. 5(B) in series corresponding to the number of the source lines 202. In addition, the source scan circuit 512 includes P-channel type TFTs 501*a* to 501*e*, N-channel type TFTs 502*a* to 502*e*, a power supply terminal 503, a ground terminal 504, an input terminal 505, and an output terminal 506.

The input terminal 505 on the first stage of the source scan circuit 512 is connected to the source start pulse terminal 514, and inputted with a source start pulse. The output terminal 506 is connected to the input terminal 505 on the next stage and to the control electrode of the video signal switch element 513. In addition, to each of the terminals as denoted by CK and CKB in FIG. 5(B), a clock pulse and an inverted signal thereof are inputted each other. It should be noted that the description of CK and CKB is reversed every stage.

The output terminals 506 on the k-th stage and the (k+1)-th stage may be inputted to a NAND circuit to control a pulse width.

More detailed connection and normal scan operation are omitted herein.

The source scan circuit 512 shown in FIG. 5(B) has a different configuration from that of the CMOS inverter shown in Embodiment Mode 1, however, an output can be determined by controlling a power supply as in Embodiment Mode 1.

When the power supply terminal 503 and the ground terminal 504 are set at a desired potential V, the potential at the output terminal 506 is also at the desired potential V. This is applied to all the stages of the source scan circuit 512.

At this time, the potential V at the output terminal is not influenced by the source start pulse inputted to the source start pulse terminal 514, the source clock pulse inputted to the source clock pulse terminal 515, and the internal state of the source scan circuit 512.

All the output terminals 506 in the source scan circuit 512 reach the potential V, which is applied to the control electrode of the video signal switch element 513. Provided that the potential V is set to meet the conditions for turning ON the video signal switch element 513, the potential of the video signal which is inputted to the video signal input terminal 510 is applied to the source line 202.

By the way, in order to carry out an inspection of whether or not there is any short-circuit between the source line 202 and the gate line 203 in FIG. 2, it is required that, in the case where the source driver 209 and the gate driver 211 are set in the normal operating state, a start pulse and a clock pulse are inputted, and a power supply potential is set at a normal operating potential.

On the other hand, in this embodiment mode, the inspection of a short-circuit can be carried out easily by obtaining a desired output regardless of an input signal by controlling a power supply potential.

Specifically, a desired potential Vg is applied to the power supply terminal 403 and the ground terminal 404 of the gate driver 411 while the power supply terminal 503 and the ground terminal 504 of the source driver 511 are set at the potential which turns ON the video signal switch element 513, and a desired potential Vs is applied to the video signal input terminal 510.

Accordingly, the source line 202 is at the Vs while the gate line 203 is at the potential Vg. When the Vs and the Vg have a potential difference, a current I flows between the power supplies of the gate driver 411 and the source driver 511. When the current I is over a specified current, it can be determined that there is a short-circuit between the source line 202 and the gate line 203.

At this time, the inspection of a short-circuit can be carried out on the basis of a specified current regardless of the gate start pulse inputted to the gate start pulse terminal 414, the gate clock pulse inputted to the gate clock pulse terminal 415, the internal state of the gate scan circuit 412, the source start pulse inputted to the source start pulse terminal 514, the source clock pulse inputted to the source clock pulse terminal 515, and the internal state of the source scan circuit 512.

In addition, since the potential difference between the Vs and the Vg can be determined regardless of the conditions which allow the gate driver 411 and the source driver 511 to be driven, the inspection can be carried out by setting potentials freely.

Furthermore, since a desired output can be obtained in relatively a short period after applying a potential, the inspection can be carried out in a short period as compared to the case of obtaining the same output by a signal input.

As described above, according to this embodiment mode, a free output of potentials can be achieved easily without the need of a clock generator. This leads to simplification of the equipment of the inspection device, omission of the manufacture of inspection signals, and further prevention of a faulty inspection result due to the error of inspection signals.

Further, a short-period inspection is enabled while achieving a free setting of potentials.

Furthermore, even in the case of a complex circuit, an output can be controlled by a power supply potential as in a simple inverter circuit. This provides the advantage that a desired output can be obtained only by setting a potential when driving a complex circuit even in the case where the internal structure and signals required for the operation are uncertain.

It should be noted that the gate driver 411 and the source driver 511 in this embodiment mode are only examples. Therefore, other semiconductor circuits which are different from this embodiment mode can operate similarly. For example, the source driver 511 may have the same configuration as the gate driver 411, or the source driver may include a current source and the like.

In addition, although the inspection of a short-circuit is carried out by applying a desired potential and measuring a current in this embodiment mode, the inspection of a short-circuit may be carried out by inputting a desired current and measuring a potential difference at that point.

(Embodiment Mode 3)

Figure 6:
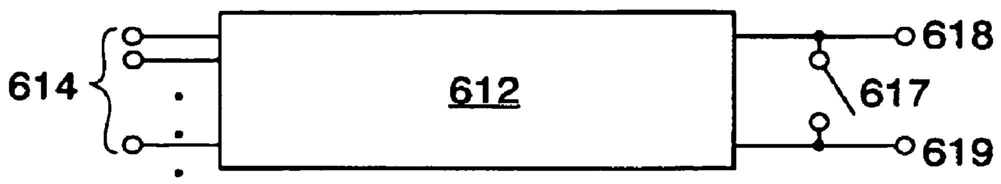
FIGS. 6A–B are diagrams showing a configuration of the invention.
Figure 6:
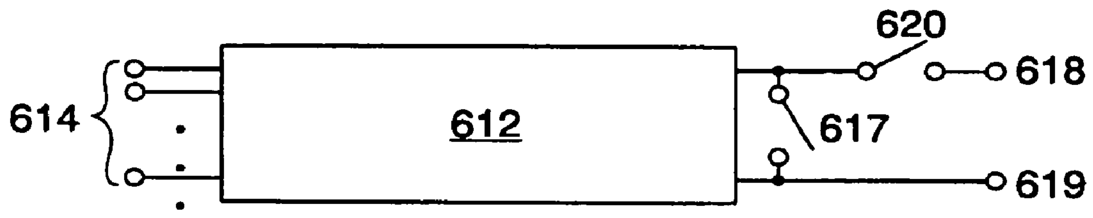

FIG. 6 show another embodiment mode of the invention. This embodiment mode intends to realize the operation shown in Embodiment Modes 1 and 2 with one power supply by using a switch for controlling a connection of a power supply terminal and a ground terminal.

A circuit shown in FIG. 6(A) includes an object circuit 612 whose output is controlled by a power supply, a signal terminal group 614, a power supply short-circuiting switch 617, a power supply terminal 618, and a ground terminal 619. It should be noted that the circuit as an object corresponds to the inverter shown in Embodiment Mode 1, the source driver 511 and the gate driver 411 shown in Embodiment Mode 2, or the like.

The object circuit 612 is inputted with a signal from the signal terminal group 614, and applied with a power supply and a ground potential from the power supply terminal 618 and the ground terminal 619 respectively. In addition, it includes the power supply short-circuiting switch 617 which short-circuits the power supply terminal 618 and the ground terminal 619.

The number of terminals in the signal terminal group 614 may be arbitrary from zero to plural. The signal terminal group 614 corresponds to the gate start pulse terminal 414 and the gate clock pulse terminal 415 if the object circuit 612 is the gate driver circuit 411, for example.

The power supply short-circuiting switch 617 may be provided either over the same insulating substrate as the object circuit 612 or outside of the inspection device or the like.

In FIG. 6(A), a desired output can be obtained regardless of an input signal by applying an arbitrary potential to the power supply terminal and the ground terminal as in Embodiment Modes 1 and 2. At this time, it is required that each of the power supply terminal and the ground terminal is applied with a potential. By turning ON the power supply short-circuiting switch 617, a potential can be applied to each of the power supply terminal 618 and the ground terminal 619 even when either of them is in a floating state.

According to this embodiment mode, either of the power supply terminal 618 or the ground terminal 619 can be used as a floating terminal by using the power supply short-circuiting switch 617. Therefore, the power supply potential for the circuit as an object can be set equal to the ground potential by bringing either of the power supply terminal 618 or the ground terminal 619 into a floating state without changing an input potential to each of them, which leads to realize the simplification of the power supply device. In addition, since the time for changing the power supply potential is not required, inspection time and the like can be reduced.

A circuit shown in FIG. 6(B) corresponds to the circuit shown in FIG. 6(A) which is additionally provided with a power supply connecting switch 620. The power supply switch 620 is provided between the power supply short-circuiting switch 617 and the power supply terminal 618.

The power supply connecting switch 620 may be provided between the power supply short-circuiting switch 617 and the ground terminal 619 as well.

When the power supply short-circuiting switch 617 is OFF, the power supply connecting switch 620 is turned ON and a normal operation is performed. On the other hand, when the power supply short-circuiting switch 617 is ON, the power supply connecting switch 620 is turned OFF and an output is controlled by a power supply.

When the power supply connecting switch is turned OFF, a power supply device for supplying a potential to the power supply terminal 618 is disconnected to the object circuit 612. This means that an equal potential can be applied to the power supply terminal 618 and the ground terminal 619 by the power supply short-circuiting switch 617 and the power supply connecting switch 620 even in the state in which a different potential is applied to each of the terminals since an output of the power supply device does not have a floating function.

(Embodiment Mode 4)

Figure 7:
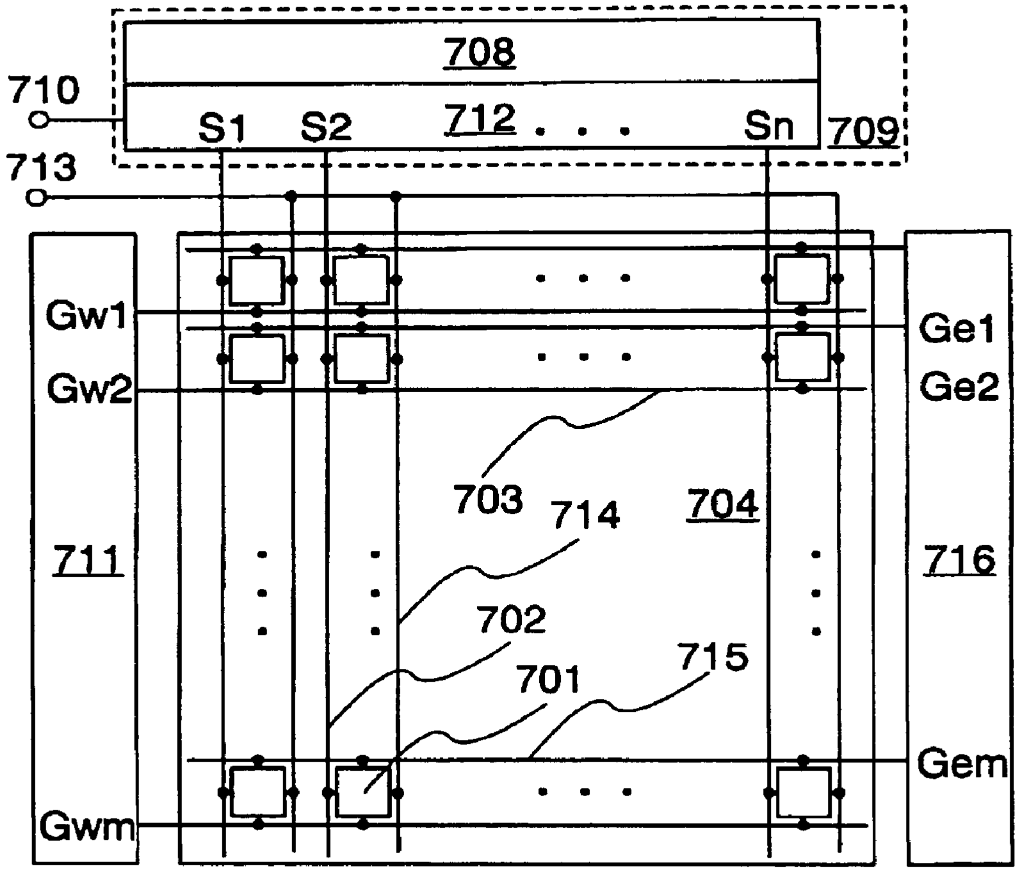
FIG. 7 is a diagram showing a driving method of the invention.

FIG. 7 shows another embodiment mode of the invention. This embodiment mode intends to carry out an inspection of whether or not there is any short-circuit between a source line and a gate line, between the source line and a current supply line, between adjacent gate lines, and between the power supply line and the gate line in a display device formed by using light emitting elements such as electro luminescence elements.

FIG. 7 shows an example of a display device using EL elements. It includes a pixel portion 704, a source driver 709, a video signal input terminal 710, a write gate driver 711, and an erase gate driver 716. The pixel portion 704 includes pixels 701 which are arranged in matrix of m rows by n columns, n source lines 702 corresponding to the columns, m write gate lines 703 corresponding to the rows, erase gate lines 715, and current supply lines 714 connected to each of the pixels 701. The source driver 709 includes a source scan circuit 708 and a latch circuit 712. The latch circuit 712 holds video signals which are inputted from the video signal input terminal 710 according to the scan by the source scan circuit 708, and supplies them to the source lines 702. Each of the current supply lines 714 is supplied with a current from a current supply terminal 713, which is to be supplied to a light emitting element.

Each of the source driver 709, the write gate driver 711, and the erase gate driver 716 has a power supply terminal and a ground terminal as in Embodiment Mode 2. However, they are omitted in FIG. 7.

Figure 8:
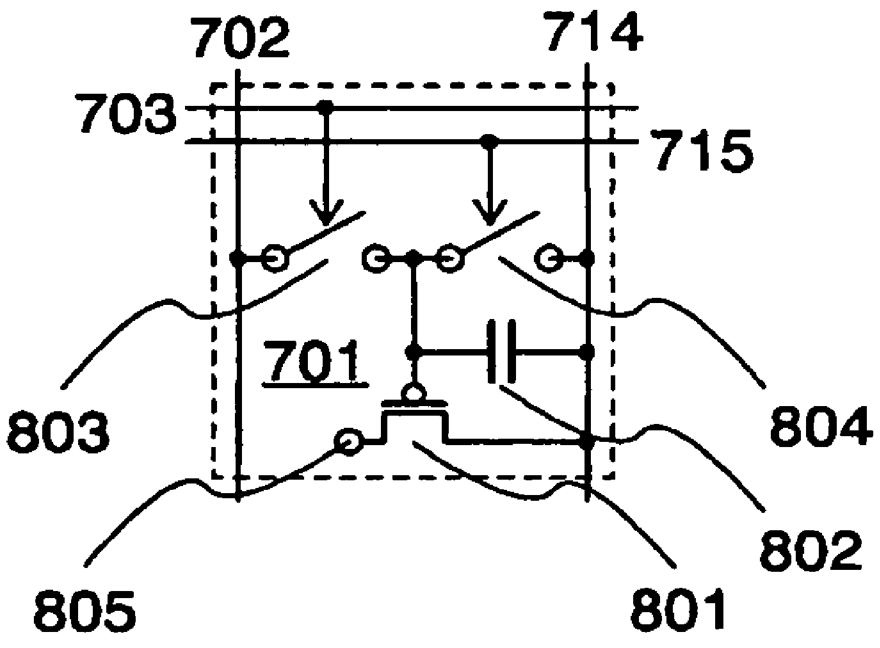
FIG. 8 is a diagram showing a driving method of the invention.

FIG. 8 shows a configuration example of the pixel 701. The pixel 701 includes a current supply TFT 801, a pixel capacitor 802, a write switch 803, an erase switch 804, and a light emitting element terminal 805 connected to a light emitting element. The pixel 701 is connected to the source line 702, the write gate line 703, the erase gate line 715, and the power supply line 714.

A driving method of the pixel is divided into a write drive, a light emitting drive, and an erase drive. In the write drive, first of all, the latch circuit 712 holds a video signal which is inputted from the video signal input terminal 710 according to the scan drive of the source scan circuit 708, and then outputs it to the source line 702. At the same time, the write switch 803 in the corresponding row is turned ON by the scan drive of the write gate driver 711. The video signal outputted to the source line 702 is held in the pixel capacitor 802 in the pixel 701 in the corresponding row. The above write drive is performed from the first to the m-th rows in sequence.

In the light emitting drive, the current supply TFT 801 is driven by the video signal held in the pixel capacitor 802, and a current is supplied to the light emitting element which is connected to the light emitting element terminal 805, thus the light emitting element emits light according to the supplied current.

In the erase drive, the erase switch 804 in the corresponding row is turned ON by the erase gate driver 716, and the video signal held in the pixel capacitor 802 is erased. At the same time, current supply to the light emitting element is stopped, and thus the light emitting element emits no light. The above write drive is performed from the first to the m-th rows in sequence.

The erase drive is not necessarily performed.

Figure 1:
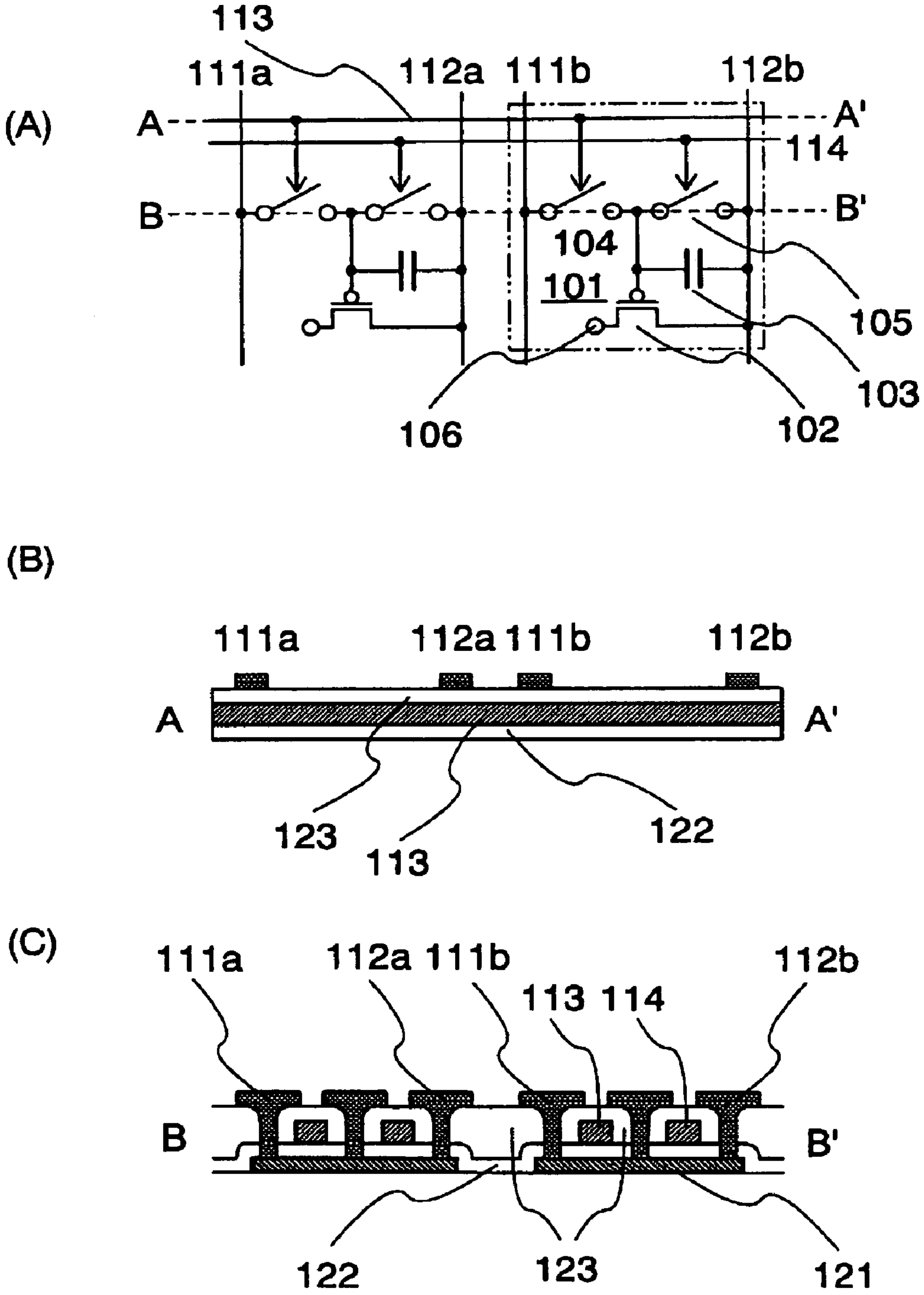
FIGS. 1A–C are examples of a subject-of-inspection of the invention.

FIG. 1 show an example of the pixel shown in FIG. 8 and its cross sectional views. It should be noted that the cross sectional views show only primary wirings and the like, and therefore, not all the components are shown.

In FIG. 1(A), reference numeral 101 denotes a pixel, 102 denotes a current supply TFT, 103 denotes a pixel capacitor, 104 denotes a write switch, 105 denotes an erase switch, and 106 denotes a light emitting element terminal. In FIG. 1(B) and FIG. 1(C), reference numerals 111*a* to 111*b* denote source lines, 112*a* to 112*b* denote power supply lines, 113 denotes a write gate line, 114 denotes an erase gate line, 121 denotes silicon, 122 denotes a gate oxide film, and 123 denotes an interlayer film.

An example of the cross sectional view taken along a line A–A' in FIG. 1(A) is shown in FIG. 1(B). Among the wirings shown in the cross section, a first portion in which a defect of a short-circuit is likely to occur is between the source lines 111*a* and 111*b*, and the write gate line 113. A second probable portion is between the source lines 111*a* and 111*b* and the current supply lines 112*a* and 112*b*. In the second portion, in particular, a defect of a short-circuit is likely to occur between the source line 111*b* and the current supply line 112*a* as they are positioned quite close to each other. A third probable portion is between the power supply lines 112*a* and 112*b* and the write gate line 113.

An example of the cross sectional view taken along a line B–B' in FIG. 1(A) is shown in FIG. 1(C). Each of the write switch 104 and the erase switch 105 in FIG. 1(C) is formed of a TFT, which includes silicon 121, a gate oxide film 122, a write gate line 113, an erase gate line 114, and the like.

Among the wirings shown in the cross section in FIG. 1(C), a first portion in which a defect of a short-circuit is likely to occur is between the source lines 111*a* and 111*b* and the write gate line 113. A second probable portion is between the source lines 111*a* and 111*b* and the current supply lines 112*a* and 112*b*. In the second portion, in particular, a defect of a short-circuit is likely to occur between the source line 111*b* and the current supply line 112*a* as they are positioned quite close to each other. A third probable portion is between the current supply lines 112*a* and 112*b* and the write gate line 113. A fourth probable portion is between the source lines 111*a* and 111*b* and the erase gate line 114. A fifth probable portion is between the write gate line 113 and the erase gate line 114. A sixth probable portion is between the current supply lines 112*a* and 112*b* and the erase gate line 114.

An inspection of a short-circuit between the source line 702 and the write gate line 703 or the erase gate line 715 is shown. A defect that can be found in this inspection is those in the first portion and the fourth portion.

A power supply terminal and a ground terminal of the latch circuit 712 are controlled to apply a potential Vs to the source line 702. In addition, a power supply terminal and a ground terminal of either or both of the write gate line 703 and the erase gate line 715 are controlled to apply a potential Vg to either or both of the write gate line 703 and the erase gate line 715.

When the Vs and the Vg have a potential difference, a current I flows between the power supply terminal or the ground terminal of the latch circuit 712 and the power supply terminal or the ground terminal of either or both of the write gate line 703 and the erase gate line 715. When the current I is over a specified current, it can be determined that there is short-circuit between the source line 702 and either or both of the write gate line 703 and the erase gate line 715.

An inspection of a short-circuit between the source line 702 and the current supply line 714 is shown. A defect that can be found in this inspection is that in the second portion.

The power supply terminal and the ground terminal of the latch circuit 712 are controlled to apply a potential Vs to the source line 702. In addition, a potential Va is applied to the current supply terminal 713.

Here, an inspection of a short-circuit between the source line 702 and the current supply line 714 is carried out. In the case where a switch element is provided between the source line 702 and the current supply line 714 as shown in FIG. 8, the source line 702 and the current supply line 714 are required to be disconnected electrically by turning OFF the switch element. The switch element corresponds to a write switch 803 and an erase switch 804 in FIG. 8.

When the source line 702 and the current supply line 714 are electrically connected by the switch element, a current flows between the source line 702 and the current supply line 714 even when there is no defect of a short-circuit. Thus, normal inspection cannot be carried out. Therefore, the switch element is turned OFF to electrically disconnect the source line 702 and the current supply line 714.

In order to electrically disconnect the source line 702 and the current supply line 714, at least one of the write switch 803 and the erase switch 804 is required to be turned OFF. For this, a potential which turns OFF the write switch 803 or the erase switch 804 is applied to the power supply terminal and the ground terminal of at least one of the write gate driver 711 and the erase gate driver 716. Accordingly, the write switch 803 or the erase switch 804 is turned OFF, and thus the source line 702 and the current supply line 714 are electrically disconnected.

Then, the source line 702 is at a potential Vs while the current supply line 714 is at a potential Va. A current which flows through the write switch 803 and the erase switch 804 can be disregarded. When the Vs and the Va have a potential difference, a current I flows between the power supply terminal or the ground terminal of the latch circuit 712 and the current supply terminal 713. When the current I is over a specified current, it can be determined that there is a short-circuit between the source line 702 and the current supply line 714.

An inspection of a short-circuit between the write gate line 703 and the erase gate line 715 is shown. A defect that can be found in this inspection is that in the fifth portion.

The power supply terminal and the ground terminal of each of the write gate line 703 and the erase gate line 715 are controlled to apply a potential Vgw to the write gate line 703 and to apply a potential Vge to the erase gate line 715.

When the Vgw and the Vge have a potential difference, a current I flows between the power supply terminal or the ground terminal of the write gate line 703 and the power supply terminal or the ground terminal of the erase gate line 715. When the current I is over a specified current, it can be determined that there is a short-circuit between the write gate line 703 and the erase gate line 715.

An inspection of a short-circuit between the current supply line 714 and the write gate line 703 or the erase gate line 715 is shown. A defect that can be found in this inspection is those in the third portion and the sixth portion.

A potential Va is applied to the current supply terminal 713 to apply the potential Va to the current supply line 714. The power supply terminal and the ground terminal of either or both of the write gate line 703 and the erase gate line 715 are controlled to apply a potential Vg to either or both of the write gate line 703 and the erase gate line 715.

When the Va and the Vg have a potential difference, a current I flows between the current supply terminal 713 and the power supply terminal or the ground terminal of either or both of the write gate line 703 and the erase gate line 715. When the current I is over a specified current, it can be determined that there is a short-circuit between the current supply line 714 and either or both of the write gate line 703 and the erase gate line 715.

It is needless to say that this embodiment mode can be applied to configurations other than those shown in FIGS. 1, 7 and 8.

This embodiment mode provides a similar advantage to that shown in Embodiment Mode 2.

It should be noted that the source driver 709, the write gate driver 711, and the erase gate driver 716 in this embodiment mode are only examples. Therefore, a similar operation can be achieved even in a different semiconductor circuit from this embodiment mode. In addition, a similar operation can be achieved even when the pixel 701 has a different configuration from this embodiment mode.

Although an inspection of a short-circuit is carried out by applying a desired potential and measuring a current in this embodiment mode, it can be carried out by inputting a desired current and measuring a potential difference at that point as well.

(Embodiment)

An embodiment of the invention is described below.

The semiconductor device of the invention can be used for various purposes. In this embodiment, examples of electronic apparatuses to which the invention can be applied are described. The electronic apparatuses described in this embodiment employ the semiconductor device or the display device described in any of Embodiment Modes 1 to 4. A driving method and an inspection method of these apparatuses are as shown in Embodiment Modes 1 to 4.

Figure 9:
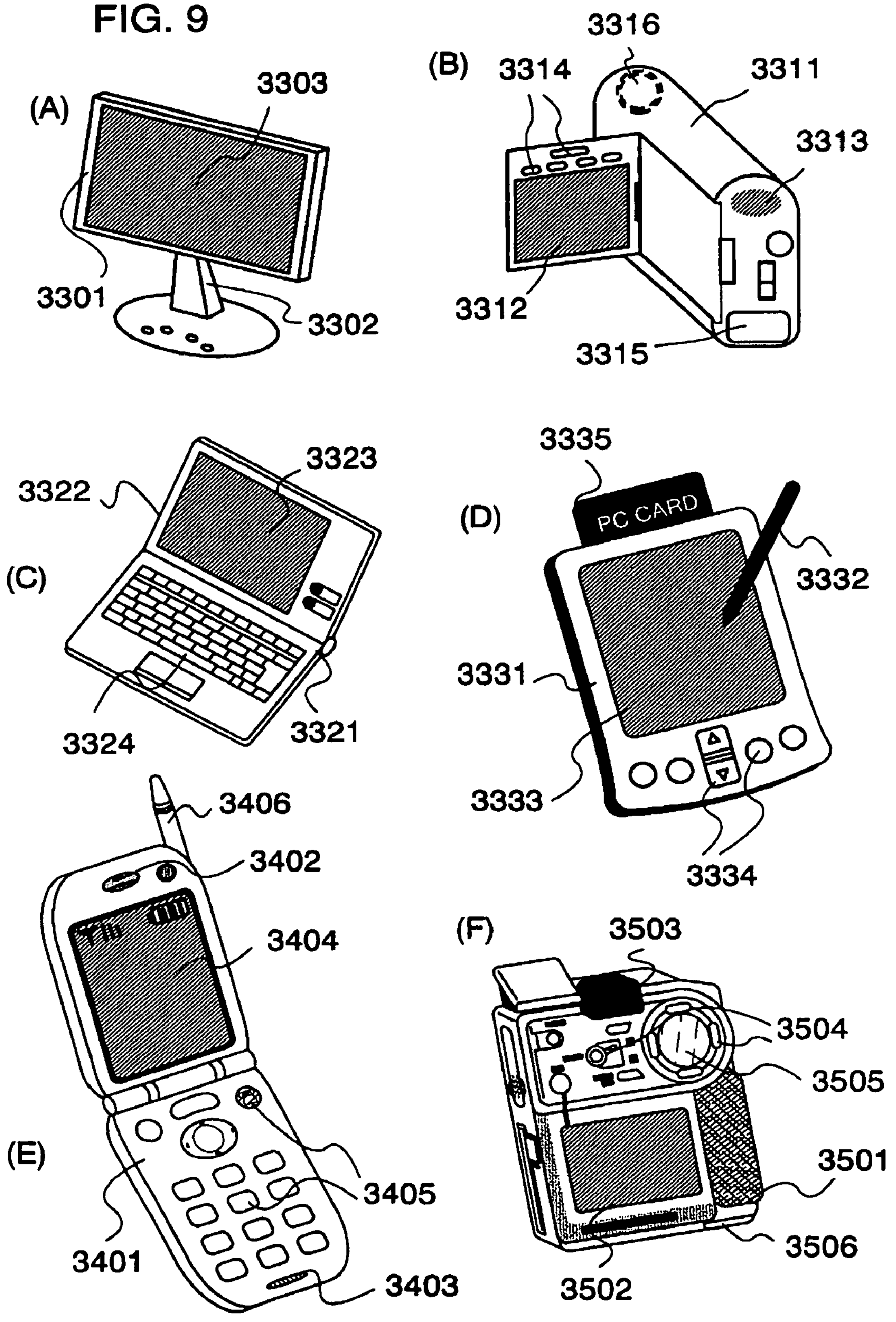
FIGS. 9A–F are views showing an embodiment of the invention.

Such electronic apparatuses include a personal digital assistance (electronic databook, mobile computer, mobile phone, and the like), a video camera, a digital camera, a personal computer, a television set, and the like. Examples of them are shown in FIG. 9.

FIG. 9(A) is an EL display which includes a housing 3301, a supporting base 3302, a display portion 3303, and the like. The display device of the invention can be used in the display portion 3303.

FIG. 9(B) is a video camera which includes a main body 3311, a display portion 3312, an audio input portion 3313, operating switches 3314, a battery 3315, an image receiving portion 3316, a semiconductor memory device (not shown), and the like. The display device of the invention can be used in the display portion 3312 and the semiconductor memory device.

FIG. 9(C) is a personal computer which includes a main body 3321, a housing 3322, a display portion 3323, a keyboard 3324, a semiconductor memory device (not shown), and the like. The display device of the invention can be used in the display portion 3323 and the semiconductor memory device.

FIG. 9(D) is a personal digital assistance which includes a main body 3331, a stylus 3332, a display portion 3333, operating buttons 3334, an external interface 3335, a semiconductor memory device (not shown), and the like. The display device of the invention can be used in the display portion 3333 and the semiconductor memory device.

FIG. 9(E) is a mobile phone which includes a main body 3401, an audio output portion 3402, an audio input portion 3403, a display portion 3404, operating switches 3405, an antenna 3406, and a semiconductor memory device (not shown). The display device of the invention can be used in the display portion 3404 and the semiconductor memory device.

FIG. 9(F) is a digital camera which includes a main body 3501, a display portion (A) 3502, an eyepiece portion 3503, operating switches 3504, a display portion (B) 3505, a battery 3506, a semiconductor memory device (not shown). The display device of the invention can be used in the display portion (A) 3502, the display portion (B) 3505, and the semiconductor memory device.

As described above, the application range of the invention is so wide that it can be applied to electronic apparatus in various fields.

INDUSTRIAL APPLICABILITY

The invention can provide a semiconductor device which obtains a desired output only by controlling a power supply even in the case of a incorporating a complex driver circuit, and a driving method thereof. Accordingly, a desired inspection can be carried out easily without the need of complex input signals for an inspection device and the like. Further, in a memory device and the like having a memory circuit and the like, its memory and internal state can be initialized simply only by controlling a power supply.

The invention claimed is:

1. A driving method of a semiconductor device comprising a transistor, a first power supply terminal, and a ground terminal, said method comprising steps of:

setting the semiconductor device for a first internal state, by setting each of the first power supply terminal and the ground terminal at a first potential, and setting the semiconductor device for a second internal state, by setting each of the first power supply terminal and the ground terminal at a second potential.

2. A driving method of a semiconductor device comprising a memory device comprising a transistor, a first power supply terminal and a ground terminal, said method comprising steps of:

setting the memory device for a first state, by setting each of the first power supply terminal and the ground terminal at a first potential, and setting the memory device for a second state, by setting each of the first power supply terminal and the ground terminal at a second potential.

3. The driving method of a semiconductor device according to claim 2, wherein the semiconductor device further comprises a display portion.

4. The driving method of a semiconductor device according to claim 3, wherein the display portion comprises a pixel portion.

5. The driving method of a semiconductor device according to claim 4, wherein the pixel portion comprises an Electro Luminescence element.

6. The driving method of a semiconductor device according to claim 3, wherein the display portion comprises a driver circuit.

7. The driving method of a semiconductor device according to claim 6, wherein the driver circuit is any one of a gate driver circuit and a source driver circuit.

8. The driving method of a semiconductor device according to claim 2, wherein the memory device comprises at least one of a CMOS circuit, a NAND circuit and a NOR circuit.

9. The driving method of a semiconductor device according to claim 2, wherein the memory device comprises at least one of a level shifter and a shift register.

* * * * *